US012724352B2

United States Patent
(12) Glimtoft et al.

(10) Patent No.: US 12,724,352 B2
(45) Date of Patent: Sep. 1, 2026

(54) EDGE PLACEMENT WITH SPATIAL LIGHT MODULATOR WRITING

(71) Applicant: Mycronic AB, Taby (SE)

(72) Inventors: Martin Glimtoft, Alvsjo (SE); Jan Sterner, Sollentuna (SE); Robert Eklund, Taby (SE); Fredric Ihren, Taby (SE); Pontus Stenstrom, Akersberga (SE)

(73) Assignee: Mycronic AB, Taby (SE)

(*) Notice: Subject to any disclaimer, the term of this patent is extended or adjusted under 35 U.S.C. 154(b) by 286 days.

(21) Appl. No.: 18/292,138

(22) PCT Filed: Sep. 27, 2022

(86) PCT No.: PCT/EP2022/076800

§ 371 (c)(1),
(2) Date: Jan. 25, 2024

(87) PCT Pub. No.: WO2023/057259

PCT Pub. Date: Apr. 13, 2023

(65) Prior Publication Data

US 2025/0093783 A1 Mar. 20, 2025

(30) Foreign Application Priority Data

Oct. 6, 2021 (EP) .................................... 21201227

(51) Int. Cl.
*G03F 7/00* (2006.01)

(52) U.S. Cl.
CPC ...... *G03F 7/70291* (2013.01); *G03F 7/70383* (2013.01); *G03F 7/70466* (2013.01); *G03F 7/70508* (2013.01); *G03F 7/70558* (2013.01)

(58) Field of Classification Search
CPC ............ G03F 7/70291; G03F 7/70383; G03F 7/70466; G03F 7/70508; G03F 7/70558
See application file for complete search history.

(56) References Cited

U.S. PATENT DOCUMENTS 6,819,450 B1 11/2004 Jolley et al.
7,934,172 B2 * 4/2011 Ivonin ................ G03F 7/70441 716/100

(Continued)

OTHER PUBLICATIONS

International Search Report for International Application No. PCT/EP2022/076800 dated Sep. 27, 2022.

(Continued)

*Primary Examiner* — Hung V Nguyen
(74) *Attorney, Agent, or Firm* — Harness, Dickey & Pierce, P.L.C.

(57) ABSTRACT

A method for preparing pixel data for writing with SLM comprises obtaining (S10) of data representing a pattern. The data is rasterized (S20) to a grid of pixels. The rasterizing comprises assigning (S22) of an edge adjustment value to pixels covering an edge of the pattern. The rasterized pattern is divided (S30) into a number of rasterized pattern planes associated with a respective radiant exposure. The sum of radiant exposures for a completely covered pixel exceeds (S32) a threshold for activating a radiation sensitive layer on a substrate, onto which the pattern is to be printed. The sum of radiant exposures for a pattern edge pixel corresponds (S34) to a quantity sufficient to move a position of where the sum of radiant exposures reaches the activation threshold a distance that corresponds to the edge adjustment value. Data representing the rasterized pattern planes are outputted (S40).

20 Claims, 11 Drawing Sheets

(56) References Cited

U.S. PATENT DOCUMENTS

| | | | | |
|---|---|---|---|---|
| 12,117,732 | B2 * | 10/2024 | Laidig | G03F 7/2051 |
| 2009/0086307 | A1 * | 4/2009 | Meisburger | G03F 7/70383<br>359/292 |
| 2020/0012195 | A1 | 1/2020 | Zable | |

OTHER PUBLICATIONS

European Search Report For European Patent Application No. 21201227.2 dated Mar. 14, 2022.

* cited by examiner

Fig. 7
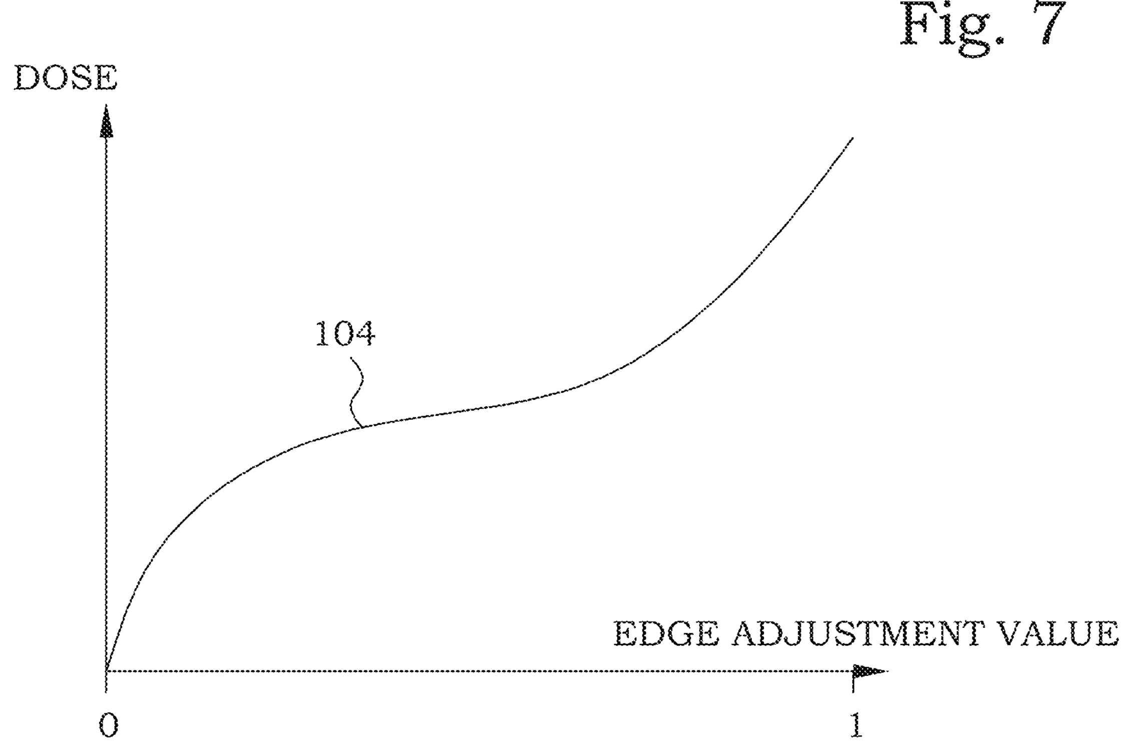
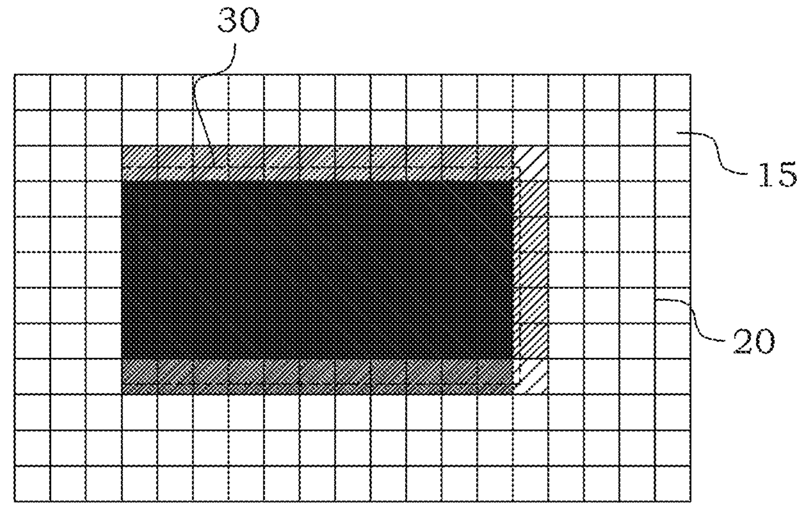
Fig. 9

RADIANT EXPOSURE
110

1
2
3
4
5
6
7
RASTERIZED PATTERN PLANE

RADIANT EXPOSURE
110

1
2
3
4
5
6
RASTERIZED PATTERN PLANE

EDGE PLACEMENT WITH SPATIAL LIGHT MODULATOR WRITING

This application is a national phase under 35 U.S.C. § 371 of PCT International Application No. PCT/EP2022/076800 which has an International filing date of Sep. 27, 2022 which claims priority to European Application No. 21201227.2 filed Oct. 6, 2021 the entire contents of each of which are hereby incorporated by reference.

TECHNICAL FIELD

The present technology relates in general to writing, such as e.g. mask writing or direct writing, and in particular to methods and arrangements for spatial light modulators.

BACKGROUND

Spatial Light Modulators (SLM), e.g. Digital Micromirror Devices (DMD), Liquid Crystal Displays (LCD), Grating Light Valves (GLV), Planar Light Valves (PLV), Micro Shutter Arrays (MSA), Analogue Spatial Light Modulators (ASLM) and/or Liquid Crystal on Silicon (LCS), are often used to obtain high-quality pattern printing. The SLM has an array of individually controllable elements arranged for generating a grid of pixels within a stamp area on a target surface. In an SLM, a pattern of the controllable elements in the SLM will be transferred into an exposure of a part of a substrate having a radiation-sensitive coating. The SLM continuously moves relative to the substrate during a stroke and successive short radiation pulses are allowed to illuminate the controllable-element array of the SLM. This results in that the instantaneous pattern of reflecting or otherwise light-allowing controllable element is "stamped" onto a part area of the substrate. The pattern of light-controlling controllable elements may then be altered before next radiation pulse is admitted, and the substrate surface is gradually covered with a patterned exposure. This exposure has a binary nature, i.e. either the exposure is enough for changing the properties of the radiation-sensitive coating, or not. In other words, if the radiation exceeds a threshold level, the radiation-sensitive coating will react. Each controllable element corresponds to a certain area at the substrate, referred to as a machine pixel.

A structure to be printed can be mapped on the machine grid of machine pixels. Machine pixels that are completely within the structure to be printed are assigned a full exposure, certifying that all parts of the machine pixel will have a radiation level exceeding the threshold level. Machine pixels that are completely outside the structure to be printed are assigned a non-exposure, certifying that all parts of the machine pixel will have a radiation level lower than the threshold level.

For machine pixels covering an edge of the structure to be printed, the situation is somewhat more complex. From a neighboring machine pixel being covered by the structure to be printed, some radiation will fall also in the edge-associated machine pixel. However, this radiation level is lower than the threshold and declines towards any "non-exposed" neighboring machine pixel. However, by adding radiation of a lower radiant exposure to the edge-associated machine pixel, the total dose closest to the structure-covered machine pixel may be caused to exceed the threshold. This results in that the edge of the area of the substrate in which the threshold is exceeded is moved towards the non-exposed neighboring machine pixels. In this way, by adapting the additional radiant exposures, an accuracy of the edge placement considerably better than the size of a machine pixel may be achieved.

A problem arises if the SLM writing uses on/off principle for the radiation. Additional exposures may be provided by multiple exposures, thereby varying the total radiation dose. However, in order to provide the different additional radiant exposures adapted to each individual edge-associated machine pixel, where the requested edge placement may differ significantly, a large number of additional exposures may be necessary. Each additional exposure reduces the allover manufacturing speed.

There is thus a need for improved methods and arrangements for precise edge placements for SLM's.

SUMMARY

A general object of the present technology is to improve spatial light modulator edge placements.

The above object is achieved by methods and devices according to the independent claims. Preferred embodiments are defined in dependent claims.

In general words, in a first aspect, a method for preparing pixel data for writing with spatial light modulators comprises obtaining, by an input interface of a rasterization module, of data representing a pattern to be printed. The pattern to be printed is rasterized to a grid of pixels, in a processing unit of the rasterization module. The rasterizing comprises assigning of an edge adjustment value to pixels covering an edge of the pattern to be printed. The edge adjustment value is a fraction of the pixel width at which the edge is to be placed, with reference to a neighboring pixel that is covered by the pattern to be printed. The rasterized pattern is divided, in the processing unit, into a number, n, of rasterized pattern planes. Each of the rasterized pattern planes is associated with a respective radiant exposure. The sum of radiant exposures of the rasterized pattern planes for a pixel that is completely covered by the pattern to be printed exceeds a threshold for activating a radiation sensitive layer on a substrate, onto which the pattern is to be printed. The sum of radiant exposures of the rasterized pattern planes for a pixel that is associated with an edge of the pattern to be printed corresponds to a quantity sufficient to move a position of where the sum of radiant exposures reaches the threshold for activating the radiation sensitive layer a distance that corresponds to the edge adjustment value. Data representing the n rasterized pattern planes are outputted by an output interface of the rasterization unit. At least two of the respective radiant exposures are different.

In a second aspect, a method for writing with a spatial light modulator comprises a step a), in which data representing n rasterized pattern planes associated with a pattern to be printed is obtained. The rasterized pattern planes are obtained by a method according to the first aspect. In a step b), a spatial light modulator is arranged according to a stamp area of the first rasterized pattern plane. In a step c), a substrate having the radiation sensitive layer is exposed for a dose of radiation corresponding to the radiant exposure associated with the first rasterized pattern plane. In a step e), the steps b) and c) are repeated for the n rasterized pattern planes by exposing with a respective associated radiant exposure. In a step f), the steps b), c) and e) are repeated for additional stamp areas in accordance with a scanning scheme.

In a third aspect, a rasterization module for preparing pixel data for writing with spatial light modulators comprises a processing unit, a memory, an input interface, and an output interface. The input interface is configured for obtaining data representing a pattern to be printed. The processing unit is configured for rasterizing the pattern to be printed to a grid of pixels. The rasterizing comprises assigning of an edge adjustment value to pixels covering an edge of the pattern to be printed. The edge adjustment value is a fraction of the pixel width at which the edge is to be placed, with reference to a neighboring pixel that is covered by the pattern to be printed. The processing unit is further configured for dividing the rasterized pattern into a number, n, of rasterized pattern planes. Each of the rasterized pattern planes is associated with a respective radiant exposure. The sum of radiant exposures of the rasterized pattern planes for a pixel that is completely covered by the pattern to be printed exceeds a threshold for activating a radiation sensitive layer on a substrate, onto which the pattern to be printed is to be printed. The sum of radiant exposures of the rasterized pattern planes for a pixel that is associated with an edge of the pattern to be printed corresponds to a quantity sufficient to move a position of where the sum of radiant exposures reaches the threshold for activating the radiation sensitive layer a distance that corresponds to the edge adjustment value. The output interface is configured for outputting data representing the n rasterized pattern planes. The processing unit is further configured for selecting the radiant exposures such that at least two of the respective radiant exposures are different.

In a fourth aspect, a pattern generator comprises a control module and an imaging module. The image module is arranged for writing a pattern to a stamp area by means of spatial light modulators. The spatial light modulator has an array of individually controllable elements arranged for generating a grid of pixels within a stamp area on a target surface. Illumination of each individual pixel is controlled by a respective element. The control module is configured for obtaining data representing n rasterized pattern planes associated with a pattern to be printed from a rasterization module according to the third aspect. The imaging module is configured for arranging the spatial light modulator according to a stamp area of the first rasterized pattern plane. The imaging module is configured for exposing a substrate having the radiation sensitive layer for a dose of radiation corresponding to the radiant exposure associated with the first rasterized pattern plane. The imaging device is configured for repeating the arranging of the spatial light modulator and the exposing for the n rasterized pattern planes by exposing with a respective associated dose of radiation. The imaging device is further configured for repeating the arranging of the spatial light modulator, the exposing, and the repeating of the same for additional stamp areas in accordance with a scanning scheme.

One advantage with the proposed technology is that a more precise edge placement can be achieved. Other advantages will be appreciated when reading the detailed description.

BRIEF DESCRIPTION OF THE DRAWINGS

The invention, together with further objects and advantages thereof, may best be understood by making reference to the following description taken together with the accompanying drawings, in which:

FIG. 7 is a diagram illustrating a relation between radiation dose and edge displacement;

FIG. 9 illustrates schematically the final result of the irradiation of FIG. 8;

DETAILED DESCRIPTION

Throughout the drawings, the same reference numbers are used for similar or corresponding elements.

For a better understanding of the proposed technology, it may be useful to begin with a brief overview of some principles of spatial light modulators (SLM).

Figures 1, 2:
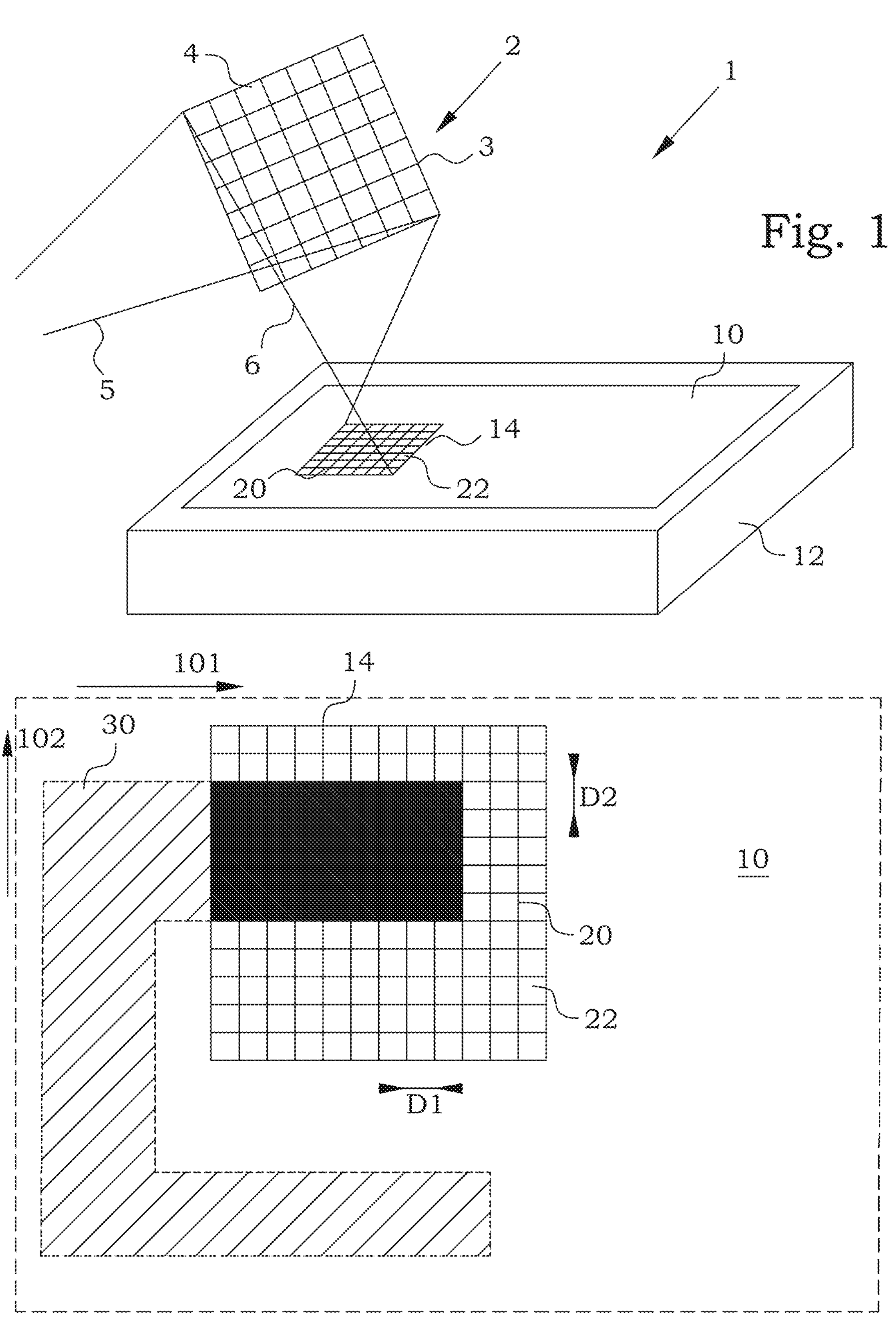
FIG. 1 illustrates schematically a pattern generator based on an SLM.
FIG. 2 illustrates schematically a part of a target surface.

FIG. 1 illustrates schematically a pattern generator 1 based on an SLM 2. The SLM 2 is here illustrated as an array 3 of individually controllable elements 4, in this embodiment radiation reflecting elements. Light 5 impinging on the array 3 will be reflected into a set of exposure beams 6 towards a target surface 10. The target surface 10 is typically supported by a target support 12. The individual elements 4 of the SLM 2 is controllable to admit reflection or to suppress reflection. Elements 4 of the SLM 2 may also be set to be disabled, thereby reducing the active part of the array 3.

The light leaving the active part of the SLM 2 is directed to the target surface 10, on which they form a grid 20 of pixels 22. Together, the pixels 22, i.e. the imaged elements, form a stamp area 14. The illumination of each individual pixel 22 is thereby controlled by a respective element 4 of the SLM 2. Typically, there is a nominal optical scaling of the stamp area 14 in relation to the SLM grid 20. This nominal scaling is a uniform scaling determined by different design parameters, such as different distances, and by ordinary optics. The arrangements for achieving such a nominal scaling are well-known by any person skilled in the art and are not further discussed.

The light 5 impinging on the array 3 is uniform in that sense that all individually controllable elements 4 are experiencing essentially the same original dose. The control of the elements 4 will therefore give an on/off operation for each individual pixel 22, while the dose measure of any light reaching the target surface 10 is determined by the dose of the impinging light 5. By controlling this impinging light 5 dose between different exposures of different areas of the target surface 10, different radiation doses can be achieved in different positions. However, all positions where the elements 4 are "on" will for each exposure be given the same dose.

After an exposure of the stamp area 14 according to the individual settings of the elements 4 of the SLM 2, the stamp area 14 can be moved. This may typically be performed by mechanically moving the SLM 2 relative the target support 12, by moving the target support 12, the SLM 2 or both. The movement of the stamp area 14 may also at least partly be performed by optical means.

The relative movement may be performed in such a way that one stamp area 14 of one exposure is placed edge-to-edge with other, previous, stamp areas 14. However, the relative movement may also provide an overlap between stamp areas 14 of different exposures. Such an overlap may just concern the edge areas of a stamp area 14, e.g. for mitigating edge effects. However, in other applications, larger overlapping portions can be used, resulting in multiple exposure strategies. This will be used with the present technology and will discussed more in detail further below.

The SLM 2 can be configured in many different ways, as noted in the background. The details of the operation of the SLM 2 is not of crucial importance for the present ideas, as long as the individual control of the elements 4 is provided and the SLM 2 gives rise to the grid 20 of pixels 22 in the stamp area 14 on the target surface 10.

FIG. 2 illustrates schematically a part of a target surface 10. A stamp area 14 of a present position of an SLM is depicted as a grid 20 of pixels 22. The pixels 22 are provided with a first pitch D1 in a first direction 101 and with a second pitch D2 in a second direction 102. In the present illustration, the number of pixels is small, for illustrational purposes. In the present situation, some of the elements of the SLM allows radiation to be directed to the stamp area 14 and are marked as black. The selection of elements at the SLM is made according to print data representing a pattern 30 intended to be printed. The intended pattern 30 is shown in dotted lines only as a reference and is not physically present at the stamp area 14. However, it can easily be seen that pixels 22 that correspond to items in the pattern 30 are illuminated, whereas pixels 22 corresponding to areas between items in the pattern 30 are not illuminated. The areas of the intended pattern 30 falling outside the present stamp area 14 are marked as hatched and will be handled by previous or subsequent printing steps.

It could be noticed that in certain applications, the illumination could be the negative correspondence to the pattern 30, i.e. that only pixels 22 outside the intended pattern are illuminated. However, this would be analogue to a "negative" pattern 30.

Figure 3:
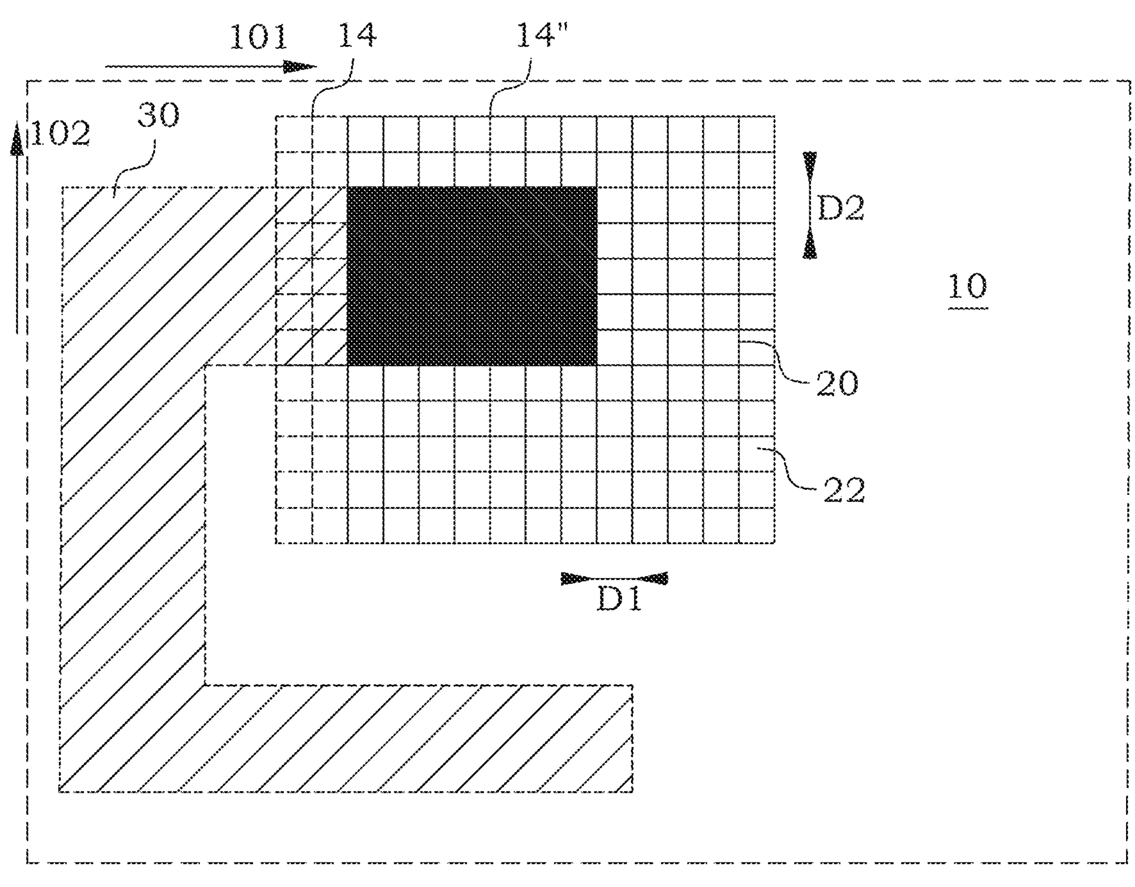
FIG. 3 illustrates schematically a part of the target surface with a moved stamp area.

With reference to FIG. 3, when a stamp area 14 has been illuminated, a movement of the stamp area 14 may be performed before a next exposure is made. In FIG. 3, an example of a next position is indicated 14". Some parts of the pattern 30 are still covered by the next stamp area 14", which parts may receive an additional illumination dose if the SLM so admits. Other parts of the pattern that previously have been illuminated, will now fall outside the new stamp area 14". Analogously, parts of the pattern 30, that previously was outside the illuminated area will now fall inside the new stamp area 14". In such a way, the entire surface of the target surface 10 can be covered, and each pixel 22 will achieve an illumination dose that is a sum of doses, when the pixel 22 is covered by the stamp area.

In other words, multiple exposures, where the stamp area 14 is moved only a fraction of the width of the stamp area 14, leading to that each point at the target surface 10 may be exposed a plurality of times. It is also possible to perform more than one exposure of a same stamp area 14, i.e. without any movement between the exposures.

A pattern to be printed is typically rasterized into a grid 20 of pixels 22. Each pixel is intended to be exposed for radiation from one or a plurality of exposures. For a pixel that is completely covered by the pattern to be printed, the sum of the doses from these exposures is configured to exceed a threshold for activating a radiation sensitive layer on a substrate, onto which said pattern is to be printed over the entire pixel surface. In such a way, the pixel becomes "exposed".

Figure 4:
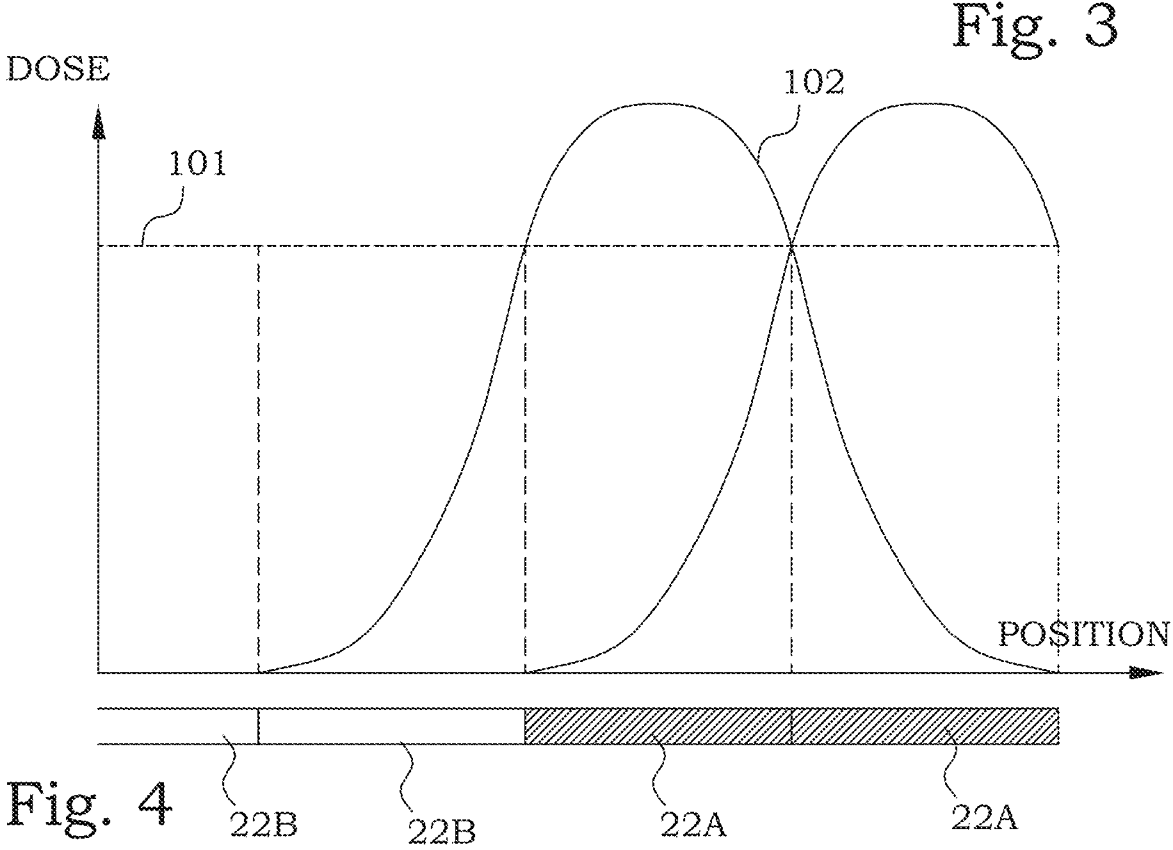
FIG. 4 is a diagram illustrating radiation doses at a target surface.

This is schematically illustrated by the diagram of FIG. 4. The one-dimensional radiation dose 102 for a number pixels are illustrated. A first group of pixels 22A are fully covered by the pattern to be printed and achieves a full dose by turning "on" the corresponding elements of the SLM. A second group of pixels 22B are situated outside the pattern to be printed, and the corresponding elements of the SLM are turned to an "off" position. Since the envelope of the radiation is not perfectly sharp, some radiation dose will appear also in the area of the pixels 22B, not intended to be radiated. However, since the magnitude of the radiation dose 102 is below the activation level 101 for the radiation sensitive layer on a substrate, no "print" will appear in the pixels 22B, not intended to be radiated. Note that the shape of the radiation dose is only schematically drawn for illustrative purposes and does not correspond to any actual measured example.

Figure 5:
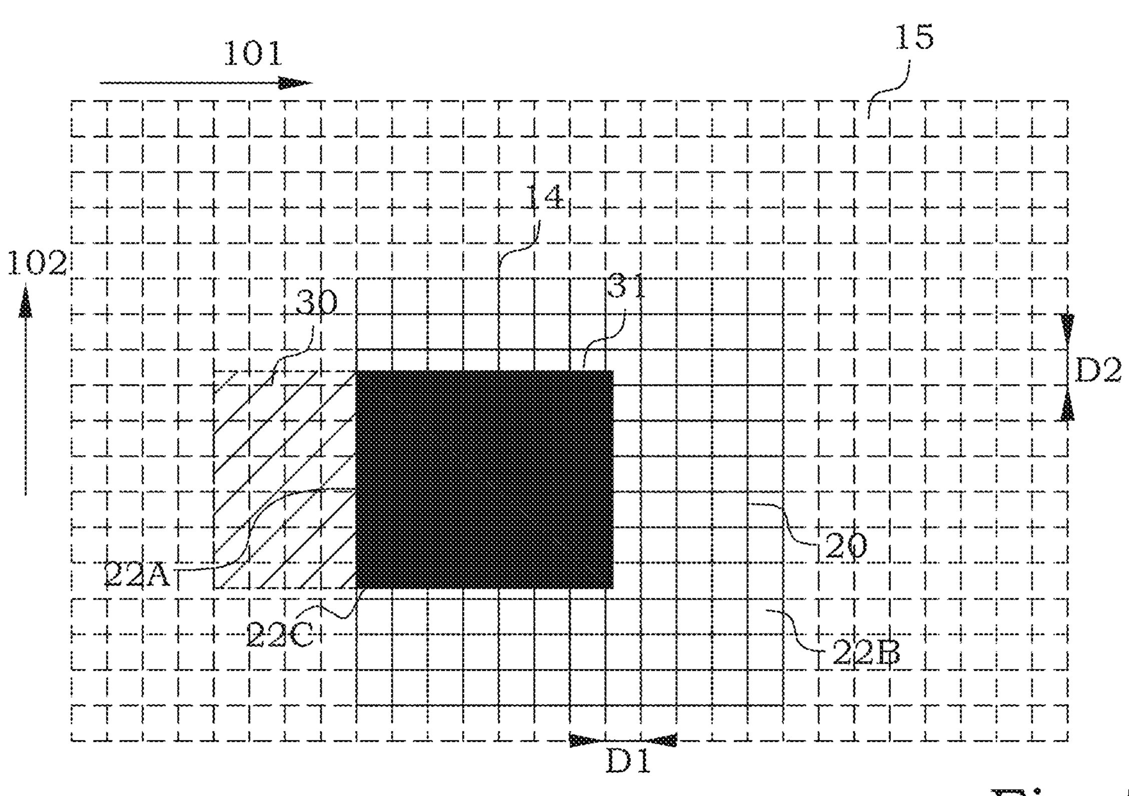
FIG. 5 illustrates schematically a part of a target surface where a pattern does not coincide with pixel borders.

This operates well as long as the edges of the pattern to be printed agrees with the grid of pixels. However, in a general case, it is not certain that it will be possible to position the pattern to be printed in registry with the grid of pixels. FIG. 5 illustrates an example where edges 31 of the pattern 30 to be printed falls in the middle of the pixels of the grid 20 of a rasterized pattern 15. There are fully covered pixels 22A, totally empty pixels 22B and partially covered pixels 22C. The fully covered pixels 22A and the totally empty pixels 22B are easily provided for. For the partially covered pixels 22C, additional measures have to be taken. A stamp area 14 is here a subarea of the rasterized pattern 15, and to print the complete pattern 30, several stamp areas 14 have to be printed.

Figure 6:
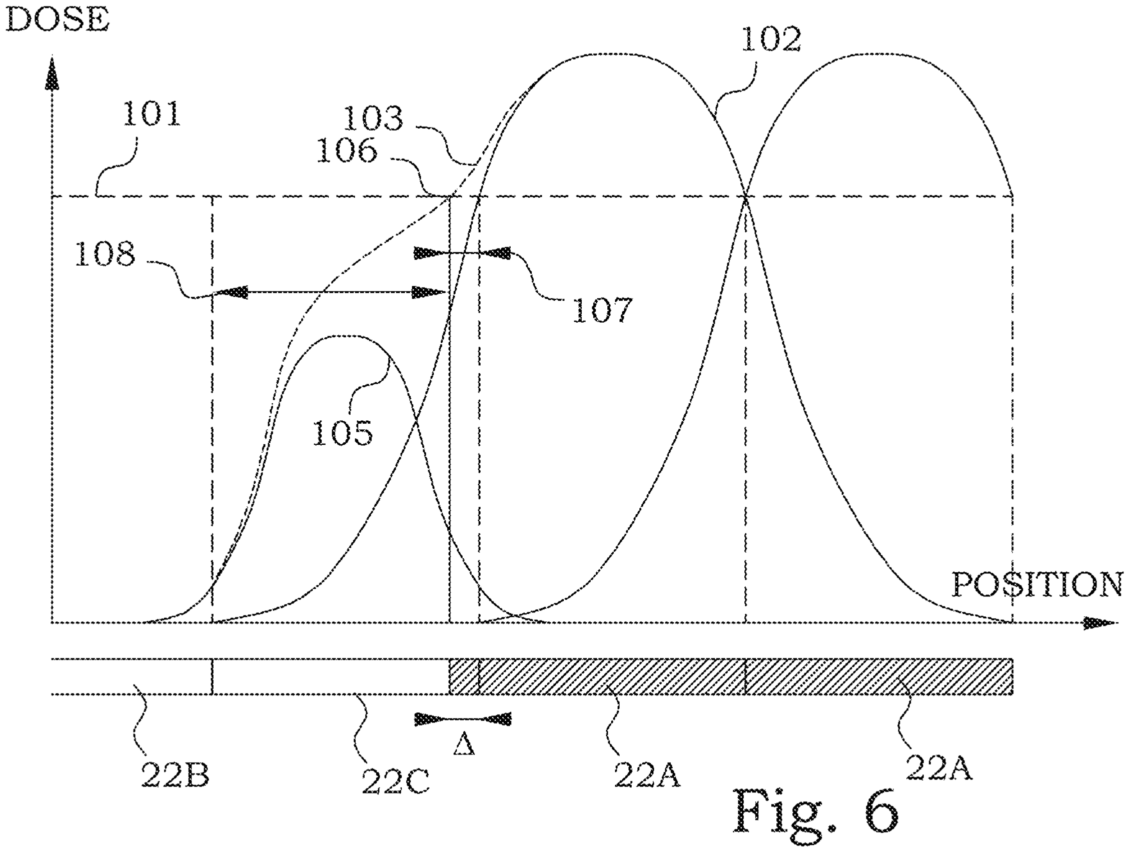
FIG. 6 is a diagram illustrating radiation doses with partial radiation doses at a target surface.

One approach for achieving an edge placement with an accuracy better than the pixel size is to irradiate the pixel by a partial radiation dose that is lower than the radiation dose for a fully covered pixel. As illustrated schematically in FIG. 6, a small radiation dose 105 in the partially covered pixel 22C will add to the radiation dose 102 that is given by the neighboring fully covered pixel 22A. The sum of these doses is illustrated by the graph 103, and this sum will reach the activation level 101 for the radiation sensitive layer on the substrate at a point 106. The part of the pixel 22C to the right of this point 106 will therefore be "exposed", whereas the part of the pixel 22C to the left of this point 106 will be "unexposed". In other words, the edge of the pattern to be printed has been moved a distance Δ.

The distance Δ preferably corresponds to the position of the pattern edge. An edge adjustment value 107 can be defined as a fraction of the pixel width 108 at which said edge is to be placed, with reference to a neighboring pixel 22A being covered by said pattern to be printed.

As illustrated by the diagram in FIG. 7, there is thus a relation 104 between an additional radiation dose that is allowed in a pixel and an edge adjustment value into the pixel in question. This relation 104 depends on the actual radiation dose distributions of the SML, but may easily be calibrated for each equipment, or for each type of equipment. Note that the curve in FIG. 7 is just for illustrational purposes and does not correspond to any real, measured, relation. This means that by modifying the radiation dose of a pixel, the edge towards a neighboring pixel may be displaced.

As mentioned above, all pixels in a grid are given essentially the same radiation dose. However, by utilizing multiple exposures, differences in radiation doses in the different pixels may be achieved. In a very basic version, the same stamp area can be exposed several times, but with different selections of pixels. If e.g. 5 exposures of the same imaging area is performed with the same impinging radiant exposure, the different pixels can be given 0%, 20%, 40%, 60%, 80% or 100% of the maximum available dose, and the edge positions can be displaced accordingly.

Figure 8:
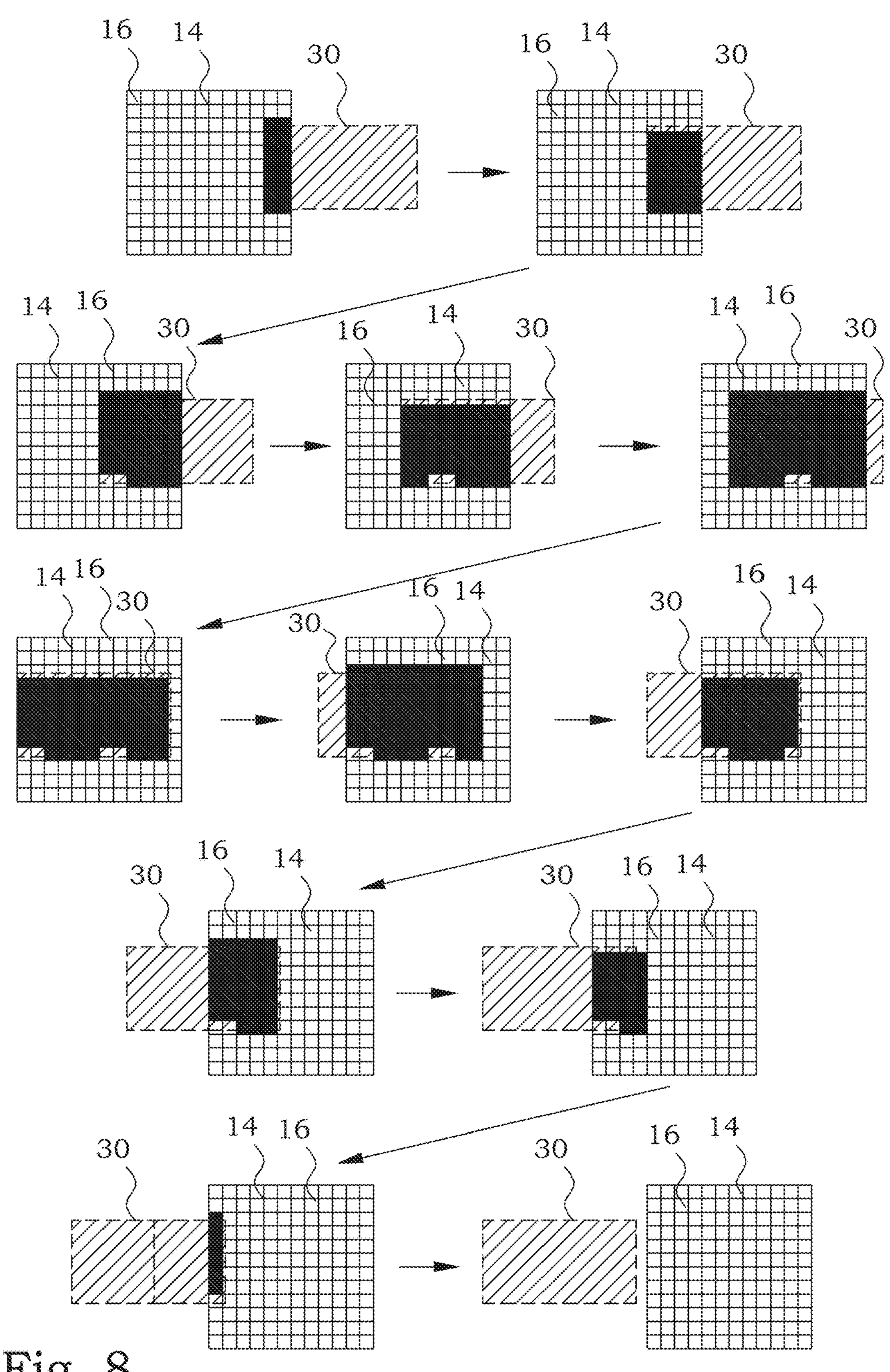
FIG. 8 illustrates schematically irradiation by a series of rasterized pattern planes.

This multiple exposure principle also operates well together with the above mentioned partially overlapping exposures. In FIG. 8, a pattern 30 to be printed is exposed in consecutive stamp areas 14, that are moved relative the substrate between each exposure. The filled squares indicate the pixels that are controlled to allow an exposure at each occasion. In this example, each place in the pattern 30 is exposed by up to 6 exposures. The stamp areas 14 are thus selected areas of rasterized pattern planes 16, together forming a rasterized pattern. The 6 exposures are thus controlled by a respective rasterized pattern plane 16, which means that the stamp areas 14 in every sixth exposure is selected from the same rasterized pattern plane 16. In pixels, where an edge displacement is to be performed, i.e. where the pattern only to a part covers the corresponding pixel, the pixel is exposed by some exposures, but non-exposed in others. The final result is schematically illustrated in FIG. 9. Here the pixels corresponding to the central parts of the pattern 30, i.e. where the pixels are fully covered by the pattern 30, are illustrated as black areas. In some pixels at the edge of the pattern 30, a lower radiation dose is provided, as indicated by the hatching. The radiation dose in these edge pixels is adapted to cause an edge displacement in agreement with the original pattern 30. A small edge displacement is caused by a small additional radiation dose and a larger edge displacement is caused by a larger additional radiation dose.

Figure 10:
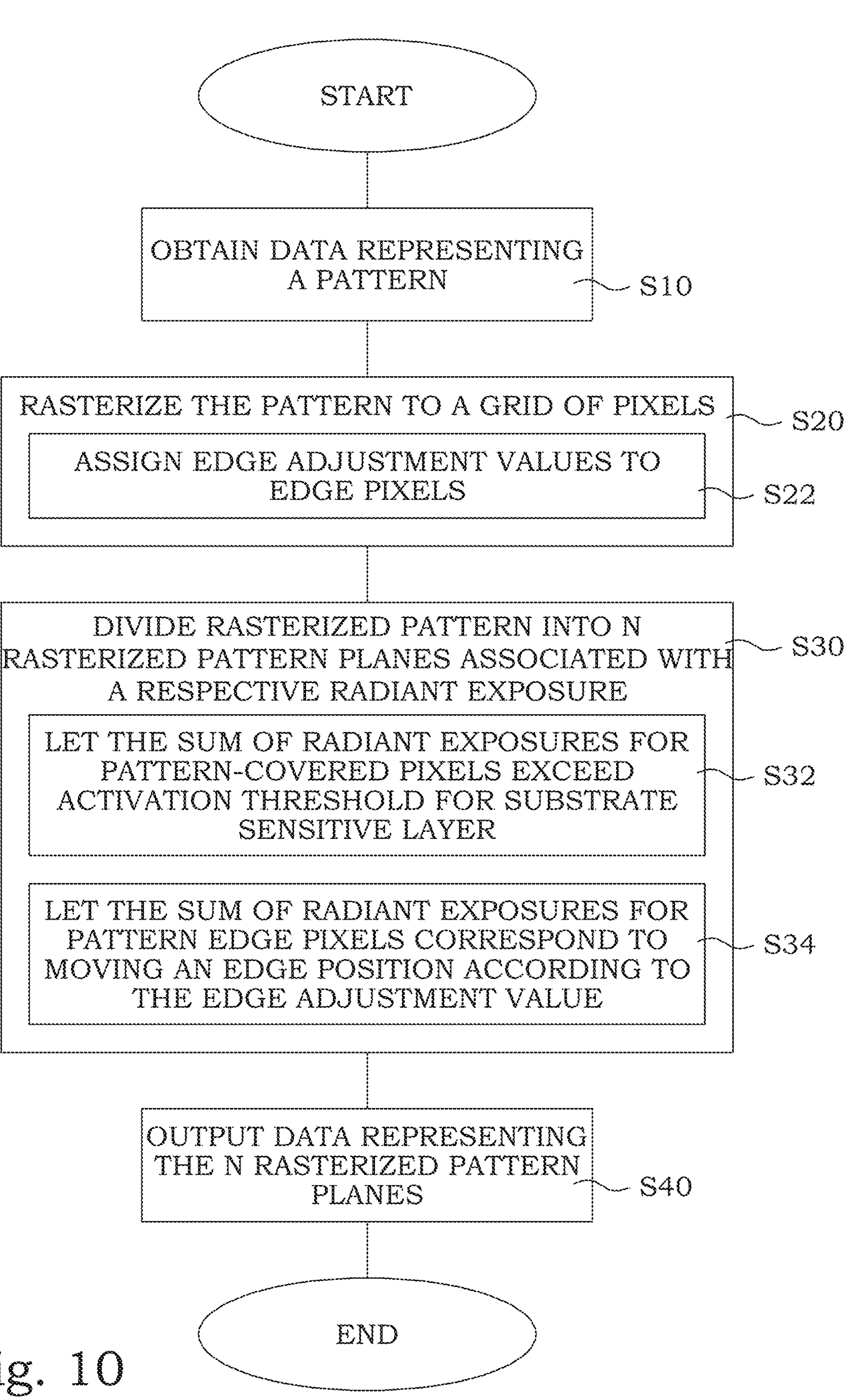
FIG. 10 is a flow diagram of steps of an embodiment of a method for preparing pixel data for writing by SLM.

FIG. 10 illustrates a flow diagram of steps of an embodiment of a method for preparing pixel data for writing with spatial light modulators, such as e.g. mask writing or direct writing. In step S10, data representing a pattern to be printed is obtained. In step S20, the pattern to be printed is rasterized to a grid of pixels. In this process, as illustrated by step S22, the rasterizing comprises assigning of an edge adjustment value to pixels covering an edge of the pattern to be printed. The edge adjustment value is a fraction of the pixel width at which the edge is to be placed, with reference to a neighboring pixel that is covered by the pattern to be printed. In other words, the edge adjustment value indicates how much the closest pattern edge of a completely covered pixel has to be displaced over the area of the partially covered pixel.

In step S30, the rasterized pattern is divided into a number, n, of rasterized pattern planes. Each rasterized pattern plane is thereby associated with one exposure of a multi-exposure process during the following pattern writing. Such a multi-exposure process may be performed with entirely overlapping exposures or partially overlapping exposures. Each of the rasterized pattern planes is associated with a respective radiant exposure. Different alternatives for this will be discussed in further detail below. The division into rasterized pattern planes is performed such that, as illustrated by step S32, the sum of radiant exposures of the rasterized pattern planes for a pixel that is completely covered by the pattern to be printed exceeds a threshold for activating a radiation sensitive layer on a substrate, onto which the pattern is to be printed. Likewise, the division into rasterized pattern planes is performed such that, as illustrated by step S34, the sum of radiant exposures of the rasterized pattern planes for a pixel that is associated with an edge of the pattern to be printed corresponds to a quantity sufficient to move a position of where the total radiant exposure reaches the threshold for activating the radiation sensitive layer a distance that corresponds to the edge adjustment value. In step S40 data representing the n rasterized pattern planes is outputted. This data can then be utilized in a method for writing with a spatial light modulator.

Figure 11:
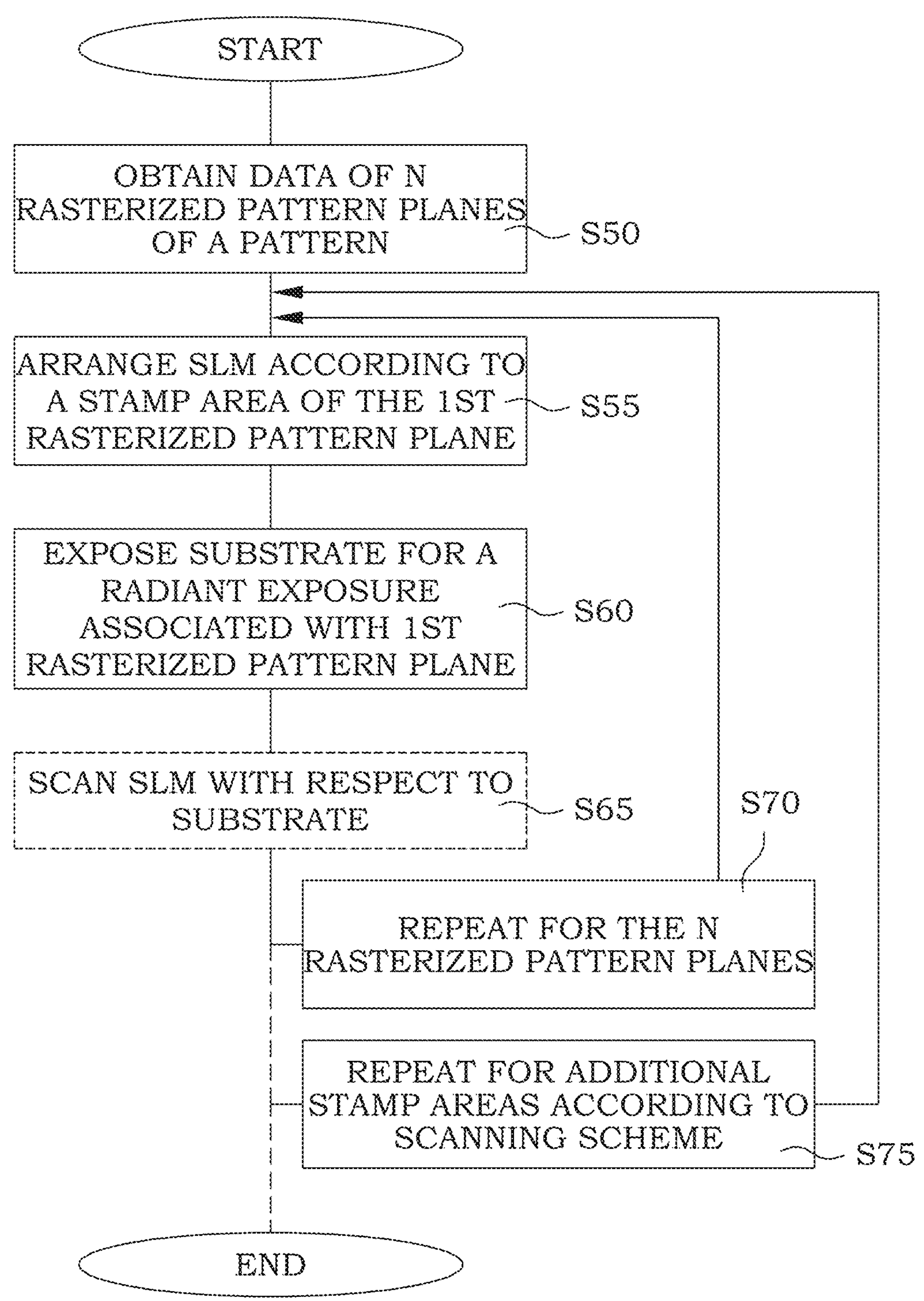
FIG. 11 is a flow diagram of steps of an embodiment of a method for writing with SLM.

FIG. 11 illustrates a flow diagram of steps of an embodiment of a method for writing in a spatial light modulator, such as mask writing or direct writing. In step S50, data representing n rasterized pattern planes associated with a pattern to be printed is obtained. The rasterized pattern planes are obtained e.g. by a method according to the above presented technology. In step S55, a spatial light modulator is arranged according to a stamp area of the first rasterized pattern plane. In step S60, a substrate having the radiation sensitive layer is exposed for a dose of radiation corresponding to the radiant exposure associated with the first rasterized pattern plane.

In one embodiment, the exposure according to the rasterized pattern planes is performed at a same area on the substrate. In such an embodiment, in step S70, a repetition of steps S55 and S60 for the n rasterized pattern planes is performed. The repetition for the n rasterized pattern planes is performed by exposing with a respective associated dose of radiation.

In another embodiment, an additional step S65 is introduced, in which the spatial light modulator is scanned with respect to the substrate a distance in a scan direction that is equal to a width of the stamp area in the scan direction divided by n. In this embodiment, the step S70 is thereby performed with respective stamp area displaced in accordance with the scanning distance, thereby partly overlapping previous exposures.

In step S75, the steps S55, S60 and S70, and if applicable step S65 are repeated for additional stamp areas in accordance with a scanning scheme.

If the radiant exposures of each rasterized pattern plane are equal, a number, n, of rasterized pattern plane make it possible to achieve n different and equidistant levels of total radiation dose for each pixel. This means that it is possible to displace a pattern edge to n different positions within the width of a single pixel. However, increasing the number of rasterized pattern planes will also reduce the printing speed. If the number of rasterized pattern planes is increased by a factor of 2, i.e. increasing the accuracy of the edge position by a factor of 2, it will also decrease the printing speed by a factor 2.

Figure 12:
FIGS. 12-15 are diagrams illustrating embodiments of sets of radiant exposures for a number of rasterized pattern planes.
Figure 12:
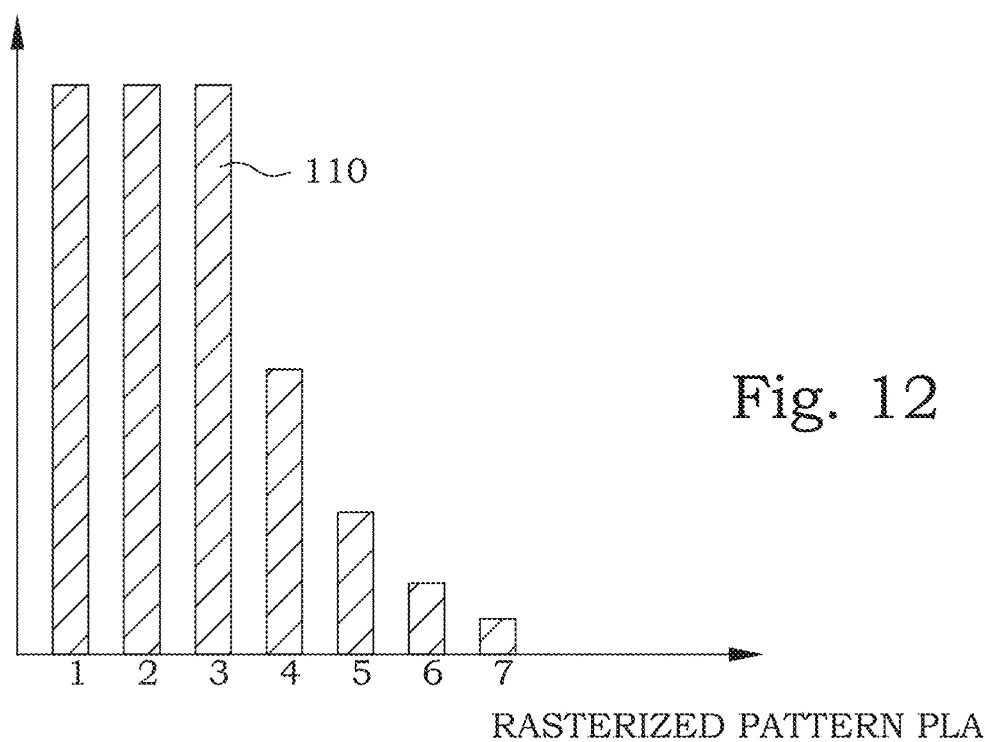

A higher number of achievable edge position displacements can, however, be achieved by admitting the radiant exposures of the rasterized pattern planes to be different. FIG. 12 is a diagram illustrating different radiant exposures 110 of a set of rasterized pattern planes. Rasterized pattern planes 1-3 are associated with a maximum radiant exposure, whereas, rasterized pattern planes 4-7 are associated with reduced radiant exposures. Since all pixels may be illuminated by all rasterized pattern planes, the rasterized pattern planes for which each pixel is "on" may be selected depending on which edge displacement that is required. In the set of rasterized pattern plane radiant exposures presented in FIG. 12, a total of 62 different edge displacements may be selected.

The radiant exposures associated with the different rasterized pattern planes can be varied by different methods, known as such by any person skilled in the art. One option may be to use optical intensity filters. Alternatively, acousto optical modulators or electro optical modulators can be used. For some lasers, direct modulation of laser output is also available. Also other types of intensity-influencing methods can be used. Since these methods, as such, are well-known to any person skilled in the art, they are not further described in detail.

However, the flexibility in achieving more precise edge displacements comes with some sacrifices. Since the maximum available radiant exposure in some rasterized pattern planes is less than what can be achieved, the total available dose for all rasterized pattern planes together is reduced. In order to compensate for this loss in total dose, either the available maximum radiant exposure has to be increased, or the exposure time has to be prolonged. Increasing the maximum radiant exposure is typically connected to high costs. Exposure time increase is also unwanted since it reduces the overall throughput. The selection of the radiant exposure scheme therefore has to be selected to suit the application in question and is typically a compromise between edge displacement accuracy and utilization degree of the radiation equipment.

In one embodiment, at least two of the respective radiant exposures are different. Each different radiant exposure increases the number of available edge displacements to select, in a most efficient setup with as much as a factor of 2.

Figure 13:
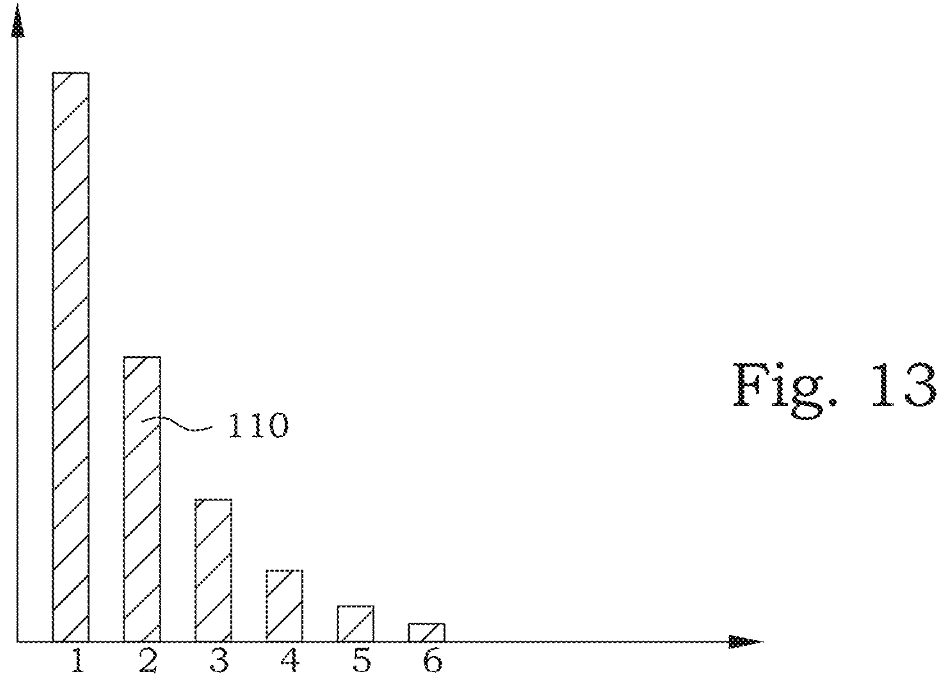

If the application requires a very high accuracy in edge displacement but is less sensitive to the utilization degree of the radiation power, the number of different radiant exposures is preferably increased. FIG. 13 is a diagram illustrating different radiant exposures of a set of rasterized pattern planes that maximizes the number of selectable edge displacements for a given number of rasterized pattern planes. In this embodiment, all of the respective radiant exposures are different.

In this embodiment, all radiant exposures have a dose that is twice as large as another of the respective radiant exposures, except for the weakest one. This embodiment provides 62 different intermediate edge displacements between no edge displacement at all and a "full displacement", i.e. a maximum illuminated pixel. However, at the same time, the printing speed is reduced by a factor of 6, and the radiation efficiency is reduced to only 33%. This approach has proved to give excellent edge positioning accuracies in test runs. In comparison, having 6 rasterized pattern planes with a same radiant exposure, will give only 5 different intermediate edge displacements, also having a 6 times reduced printing speed, but utilizes 100% of the available radiation power.

Even in embodiments where not all, except one, of the radiant exposures have a radiation dose that is twice as large as another of the respective radiant exposures, the concept of having a dose relation between different radiant exposures equal to two is often advantageous. Thus, in one embodiment, at least a majority of the respective radiant exposures have a radiation dose that is twice as large as another of the respective radiant exposures. An example of such an embodiment is the set illustrated in FIG. 12. This embodiment gives 62 possible intermediate edge displacements, a 7 times reduced printing speed, but utilizes 56% of the available radiation power.

Another disadvantage with the embodiment if FIG. 13 is that one or a few rasterized pattern planes are very dominating when it comes to the exposures. If, for such high-power exposures, the pulse energy fluctuates or if the actual placement of the dose becomes just a little bit displaced, the final result will be heavily influenced. In other words, the sensitivity for operation disturbances may be high. By having several pulses of approximately the same order of magnitude that together produce the main radiation part, the sensitivity for single, unpredictable, disturbances are reduced. For such reasons, embodiments more like the one in FIG. 12 may be to prefer. However, the choice of radiant exposure distribution is preferably made in light of the demands of the application to which it is to be applied.

Figure 14:
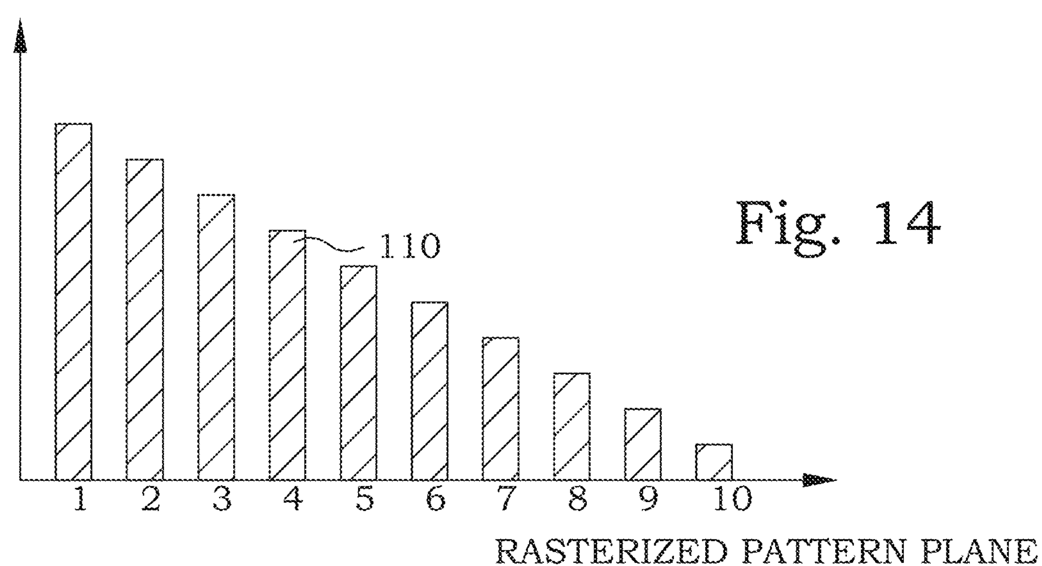

In still another approach, constant differences between different radiant exposures are used. In other words, in one embodiment, at least a majority of the respective radiant exposures are separated in radiation dose by a constant difference with respect to another of the respective radiant exposure. An advantage with such constant differences is that each available edge displacement can be reached by several different combinations of exposures, which may be beneficiary in some applications where selection of radiant exposures or rasterized pattern planes may be determined by other demands as well. FIG. 14 illustrates such an embodiment. Here, all the radiant exposures are related to each other by constant differences. This embodiment gives 54 possible intermediate edge displacements, a 10 times reduced printing speed, but utilizes 55% of the available radiation power.

Another aspect of the selection of dose levels is the order of the radiant exposures. If minor fluctuations are present in the radiation power, it may be wise to separate the rasterized patterns planes having high doses in time, so that a temporary deviation in radiation power only affect one or at least very few of the high dose rasterized pattern planes.

Likewise, as will be discussed further below, if corrections based on measured exposures are to be performed, it is advisable to have planned radiant exposures of differing magnitudes available during the entire sequence.

Figure 15:
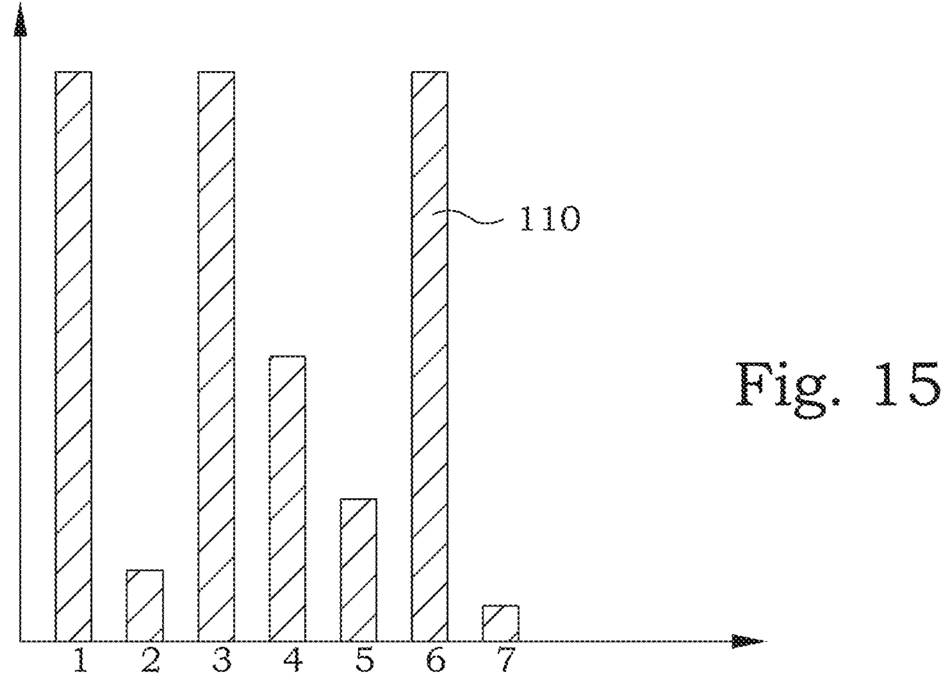

FIG. 15 illustrates an embodiment where the rasterized pattern planes with the highest doses are spread out over the entire sequence. This approach thus presents a solution where the radiant exposures are varying in a non-monotonic manner over every sequence of n rasterized pattern planes. Within one and the same sequence, there are both increased and decreased doses between successive rasterized pattern planes.

Another principle to be used for spreading out the radiant exposures is to create a large number of instances, where one dose of a high level is surrounded by two doses of lower levels and preferably also where one dose of a low level is surrounded by two doses of higher levels. In other words, in one embodiment, for a majority of the respective radiant exposures, the doses of the closest previous radiant exposure and the closest succeeding radiant exposure are either both higher or both lower.

When performing the actual writing, this results in that the radiant exposures are frequently changing between high and low doses. In other words, in one embodiment of the writing method, the rasterized pattern planes are selected in time so that at least two rasterized pattern planes are surrounded in time by rasterized pattern planes associated with lower radiant exposures, resulting in a non-monotonically time variation of radiant exposures for all pixels.

In many pattern generators of today utilizing SLM, there is provided a possibility to actually measure an exposure level of a pixel. This is, as such known in prior art, and depends on the actual configuration of the pattern generator. The details of such measurements are therefore not further discussed. It is just postulated that a person skilled in the art has the knowledge and skills to be able to perform such measurements.

The present technology may in such cases be further utilized. An exposure level of a pixel is measured after the step of exposing a substrate by one of the rasterized pattern planes. If a deviation from an expected exposure is detected, a re-scheduling of any remaining rasterized pattern planes may be performed. In other words, if the measurement and evaluation is fast enough, and there are remaining rasterized pattern planes to be used for irradiating the pixel that was measured, compensation measures may be performed. The remaining rasterized pattern planes and their respective radiant exposures may then be re-combined in order to come as close to the remaining requested exposure of the pixel in question. In other words, parts of the rasterized pattern planes not yet being used are adjusted to compensate for any deviance from an expected exposure level. The above discussed mixing of rasterized patterns planes with high dose and low dose will in such cases be beneficiary, for being able to find suitable adjustment re-arrangements of the rasterized patterns planes that are to be “on” or “off” for the pixel in question.

If a measured exposure is lower than an expected exposure, an adjustment of the exposure may alternatively also be performed e.g. during a return stroke. However, if a measure of a too high exposure is detected, adjustment cannot be performed in such a way.

The present ideas are applicable to all kinds of writing methods, however, the original targeted technical area was application to a lithography system or a photomask lithography system. Therefore, in a preferred embodiment, the pattern generator is a lithography system or a photomask lithography system. In a mask writing system, edge position requirements are typically extremely high, whereas the actual printing speed is of somewhat less importance, which means that the present ideas are particularly advantageously applied to mask writing systems. Note, however, that the same principles are useful also in e.g. different types of direct printing.

Figure 16:
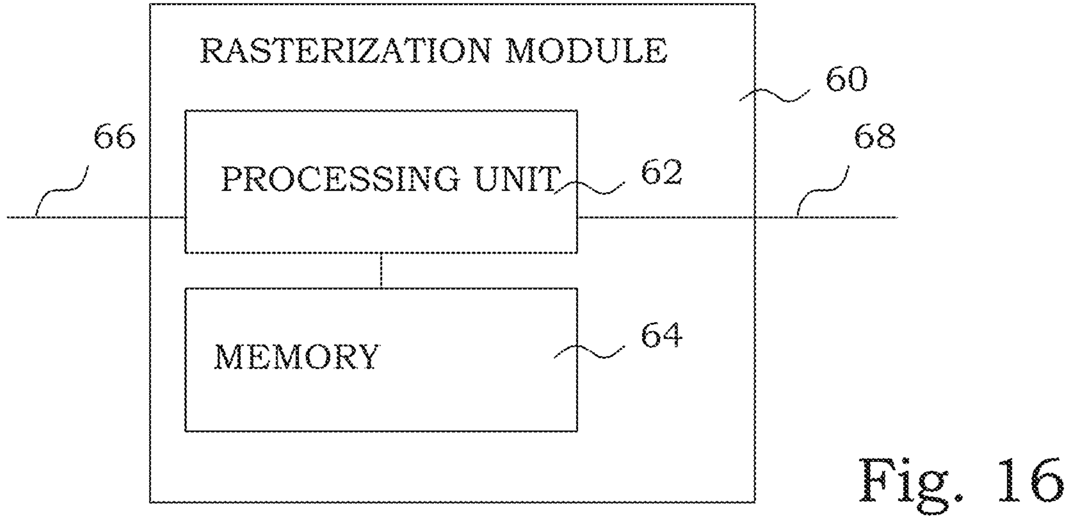
FIG. 16 illustrates schematically an embodiment of a rasterization module.

In FIG. 16, an embodiment of a rasterization module 60 for preparing pixel data for writing with SLMs is illustrated. As explained above, the SLM has an array of individually controllable elements arranged for generating a grid of pixels within a stamp area on a target surface, where illumination of each individual imaged element is controlled by a respective element. The rasterization module comprises a processing unit 62, a memory 64, an input interface 66 and an output interface 68. The input interface 66 is configured for obtaining data representing a pattern to be printed. The data representing a pattern to be printed is preferably stored in the memory 64. The processing unit 62 is configured for rasterizing the pattern to be printed to a grid of pixels. The rasterizing comprising assigning an edge adjustment value to pixels covering an edge of the pattern to be printed. The edge adjustment value is a fraction of the pixel width at which the edge is to be placed, with reference to a neighboring pixel that is covered by the pattern to be printed. Instructions for the processing unit to perform the rasterizing is preferably stored in a retrievable manner in the memory 64. The processing unit 62 is further configured for dividing the rasterized pattern into a number, n, of rasterized pattern planes. Each of the rasterized pattern planes is associated with a respective radiant exposure. The sum of radiation doses of the rasterized pattern planes for a pixel that is completely covered by the pattern to be printed exceeds a threshold for activating a radiation sensitive layer on a substrate, onto which the pattern is to be printed. Furthermore, the sum of radiant exposures of the rasterized pattern planes for a pixel that is associated with an edge of the pattern to be printed corresponds to a quantity sufficient to move a position of where the sum of radiant exposures reaches the threshold for activating the radiation sensitive layer a distance that corresponds to the edge adjustment value. The output interface 68 is configured for outputting data representing the n rasterized pattern planes.

In one embodiment, the processing unit 62 is further configured for selecting the radiant exposures such that at least two of the respective radiant exposures are different.

In a further embodiment, the processing unit 62 is further configured for selecting the radiant exposures such that all of the respective radiant exposures are different.

In one embodiment, the processing unit 62 is further configured for selecting the radiant exposures such that at least a majority of the respective radiant exposures have a radiation dose that is twice as large as another of the respective radiant exposures.

In one embodiment, the processing unit 62 is further configured for selecting the radiant exposures such that at least a majority of the respective radiant exposures are separated in radiation dose by a constant difference with respect to another of the respective radiant exposure.

In one embodiment, the processing unit 62 is further configured for selecting the radiant exposures such that they are varying in a non-monotonic manner over every sequence of n rasterized pattern planes.

In a further embodiment, for a majority of the respective radiant exposures, the doses of the closest previous radiant exposure and the closest succeeding radiant exposure are either both higher or both lower.

Figure 17:
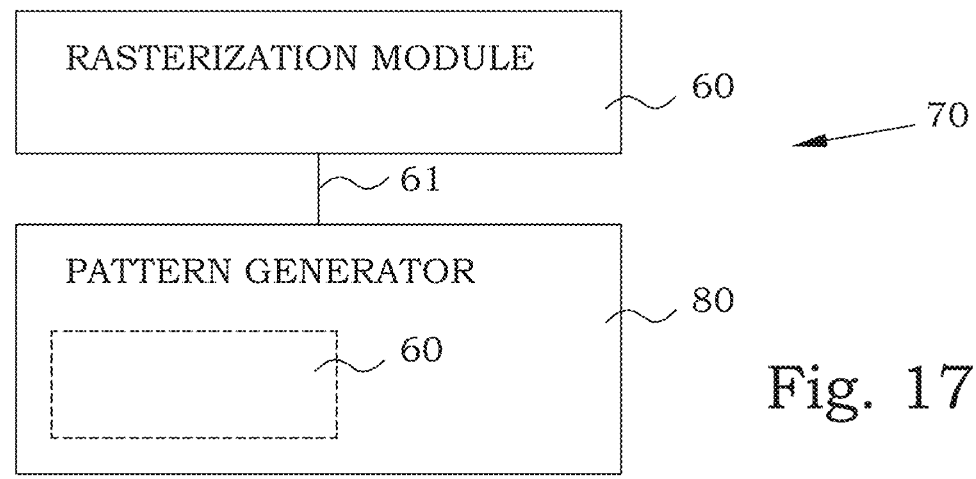
FIG. 17 illustrates schematically an embodiment of a pattern generation system.

FIG. 17 illustrates an embodiment of a pattern generation system 70, comprising a rasterization module 60 and a pattern generator 80. In this embodiment, the rasterization module 60 provides data representing n rasterized pattern planes associated with a pattern to be printed. In the present embodiment, the rasterization module 60 is illustrated as a separate unit. The rasterized pattern can then be transferred to the pattern generator 80 by a communication connection 61 or by wireless alternatives. Alternatively, the data representing a rasterized pattern can be provided by the rasterization module 60 in a data storage unit that is physically brought to the pattern generator 80 for access.

However, the rasterization module 60 may in other embodiments be provided as a part of the pattern generator 80, as illustrated by the dotted lines, where the processing capabilities preferably are shared by the pattern generator 80 and the rasterization module 60. The transfer of the rasterized pattern from the rasterization module 60 to the pattern generator 80 is then performed by internal means.

Figure 18:
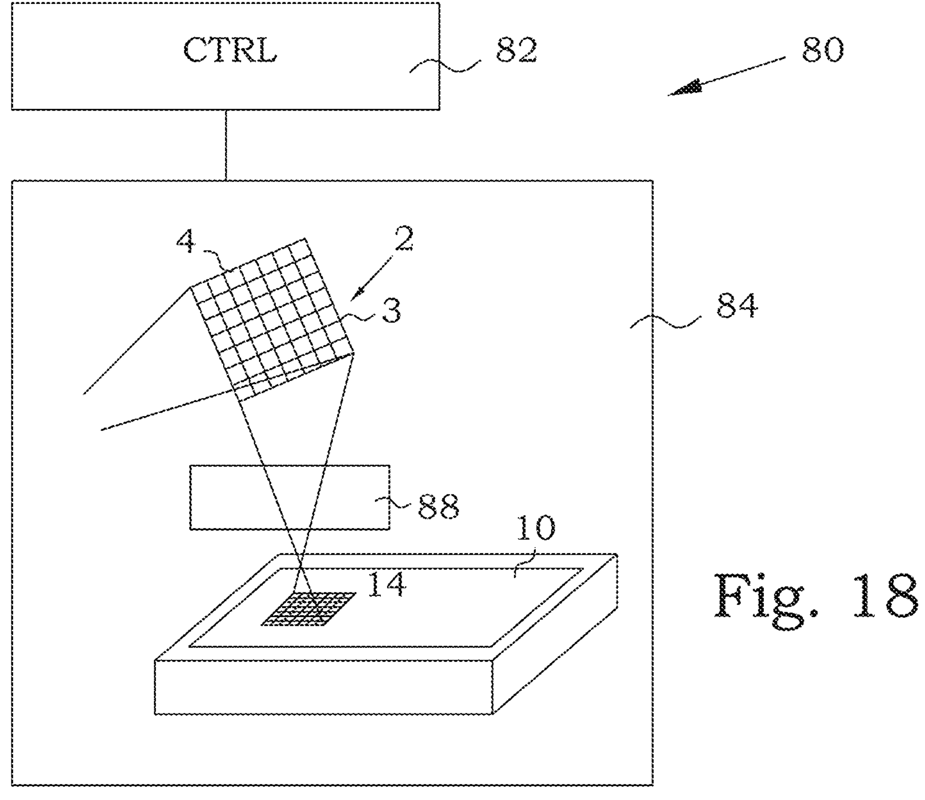
FIG. 18 illustrates schematically an embodiment of a pattern generator.

FIG. 18 illustrates schematically an embodiment of a pattern generator 80. The pattern generator 80 comprises a control module 82 and an imaging module 84. The imaging module 84 is arranged for writing a pattern to a stamp area. The imaging module comprises an SLM 2. The SLM 2 has an array 3 of individually controllable elements 4 arranged for generating a grid of pixels within a stamp area on a target surface 10. The illumination of each individual imaged element is controlled by a respective element 4, based on instructions from the control module 82.

The control module 82 is configured for obtaining data representing n rasterized pattern planes associated with a pattern to be printed from a rasterization module. As described above, this rasterized pattern can be provided in different ways, from an internal or external source, according to the principles described further above.

The imaging module 84 is configured for arranging the SLM according to a stamp area of the first rasterized pattern plane. The imaging module 84 is configured for exposing a substrate having the radiation sensitive layer for a dose of radiation corresponding to the radiant exposure associated with the first rasterized pattern plane. The imaging module 84 is configured for repeating the arranging of the SLM and the exposing for the n rasterized pattern planes by exposing with a respective associated dose of radiation. The imaging module 84 is further configured for repeating the arranging of the SLM, the exposing and the repeating of the same for additional stamp areas in accordance with a scanning scheme.

In one embodiment, the imaging device is further configured for scanning the spatial light modulator with respect to the substrate a distance in a scan direction being equal to a width of the stamp area in the scan direction divided by n. The repeating of the arranging of the SLM and the exposing is performed with respective the stamp area displaced in accordance with the scanning distance, thereby partly overlapping previous exposures. The arranging of the SLM, the exposing and the repeating of the same further comprises repeating of scanning the spatial light modulator for each rasterized pattern plane.

In one embodiment, the control module 82 is further configured for selecting rasterized pattern planes to be used by the imaging module 84 in time so that at least two rasterized pattern planes are surrounded in time by rasterized pattern planes associated with lower radiant exposures, resulting in a non-monotonically time variation of radiant exposure for all pixels.

In one embodiment, the pattern generator further comprises an exposure level measuring unit, configured for measuring an exposure level of a pixel after exposing a substrate. The control module 82 is further configured for adjusting parts of the rasterized pattern planes not yet being used, to compensate for any deviance from an expected exposure level.

The embodiments described above are to be understood as a few illustrative examples of the present invention. It will be understood by those skilled in the art that various modifications, combinations and changes may be made to the embodiments without departing from the scope of the present invention. In particular, different part solutions in the different embodiments can be combined in other configurations, where technically possible. The scope of the present invention is, however, defined by the appended claims.

The invention claimed is:

1. A method for preparing pixel data for writing with a spatial light modulator, the method comprising:

obtaining, by an input interface of a rasterization module, data representing a pattern to be printed;

rasterizing, in a processing unit of said rasterization module, said pattern to be printed to a grid of pixels to form a rasterized pattern, said rasterizing including assigning respective edge adjustment values to pixels covering an edge of said pattern to be printed, and said respective edge adjustment values each being a fraction of a pixel width of a respective assigned pixel of the pixels covering the edge of the pattern to be printed, said fraction of said pixel width being a position at which a respective portion of said edge is to be placed within the respective assigned pixel, with reference to a respective neighboring pixel that is covered by said pattern to be printed;

dividing, in said processing unit, said rasterized pattern into a plurality of rasterized pattern planes, each respective rasterized pattern plane of said plurality of rasterized pattern planes being associated with a respective radiant exposure for each pixel of the grid of pixels intended to be exposed by said respective rasterized pattern plane, such that the plurality of rasterized pattern planes are associated with respective radiant exposures, wherein a sum of radiant exposures of said plurality of rasterized pattern planes for a pixel completely covered by said pattern to be printed exceeds a threshold for activating a radiation sensitive layer on a substrate, onto which said pattern is to be printed, and wherein a sum of radiant exposures of said plurality of rasterized pattern planes for each respective pixel of the pixels covering the edge of said pattern to be printed is an exposure moving a respective position of where the sum of radiant exposures for the respective pixel reaches said threshold for activating said radiation sensitive layer at the respective pixel, the exposure moving the respective position by a respective distance equal to a respective edge adjustment value that is assigned to the respective pixel; and outputting, by an output interface of said processing unit, data representing said plurality of rasterized pattern planes, wherein at least two of said respective radiant exposures of said plurality of rasterized pattern planes have different magnitudes with respect to each other.

2. The method according to claim 1, wherein all of said respective radiant exposures of said plurality of rasterized pattern planes have different magnitudes with respect to each other.

3. The method according to claim 1, wherein at least a majority of said respective radiant exposures have a radiation dose that is twice as large as another of said respective radiant exposures, wherein the majority means more than half of said respective radiant exposures.

4. The method according to claim 1, wherein at least a majority of said respective radiant exposures are separated in radiation dose by a constant difference with respect to another of said respective radiant exposures, wherein the majority means more than half of said respective radiant exposures.

5. The method according to claim 1, wherein said radiant exposures are varying in a non-monotonic manner over every sequence of the plurality of rasterized pattern planes, wherein the non-monotonic manner comprises both increases of said radiant exposures and decreases of said radiant exposures over every sequence of the plurality of rasterized pattern planes.

6. The method according to claim 5, wherein, for a majority of said respective radiant exposures, respective doses of a temporally closest previous radiant exposure and a temporally closest succeeding radiant exposure are either both higher or both lower, wherein the majority means more than half of said respective radiant exposures.

7. A method for writing in a spatial light modulator, the method comprising:

a) obtaining data representing a plurality of rasterized pattern planes associated with patterns to be printed, said plurality of rasterized pattern planes being obtained by the method according to claim 1;

b) arranging a spatial light modulator according to a stamp area of a first rasterized pattern plane of the plurality of rasterized pattern planes;

c) exposing a substrate having said radiation sensitive layer for a dose of radiation corresponding to a radiant exposure associated with said first rasterized pattern plane;

e) repeating steps b) and c) for remaining rasterized pattern planes of the plurality of rasterized pattern planes by exposing the substrate with a respective associated doses of radiation associated with the remaining rasterized pattern planes; and f) repeating steps b), c) and e) for additional stamp areas in accordance with a scanning scheme.

8. The method according to claim 7, further comprising:

d) scanning said spatial light modulator with respect to said substrate a scanning distance in a scan direction being equal to a width of said stamp area in said scan direction divided by n, n being a quantity of rasterized pattern planes comprising the plurality of rasterized pattern planes, wherein step e) is performed with respective said stamp area displaced in accordance with said scanning distance, thereby partly overlapping temporally previous exposures, and wherein said repeating of step f) further comprises step d).

9. The method according to claim 7, wherein said plurality of rasterized pattern planes are selected in time so that at least two rasterized pattern planes of the plurality of rasterized pattern planes are surrounded in time by rasterized pattern planes of the plurality of rasterized pattern planes associated with lower radiant exposures, resulting in a non-monotonically time variation of radiant exposures for all pixels, wherein the non-monotonically time variation comprises both increases of said radiant exposures and decreases of said radiant exposures in time.

10. The method according to claim 7, further comprising:

measuring an exposure level of a pixel after the step c) of exposing the substrate; and adjusting parts of said plurality of rasterized pattern planes not yet being used, to compensate for any deviance from an expected exposure level.

11. A rasterization module for preparing pixel data for writing with a spatial light modulator, the rasterization module comprising:

a memory;

an output interface;

an input interface, said input interface being configured for obtaining data representing a pattern to be printed; and a processing unit, said processing unit being configured for rasterizing said pattern to be printed to a grid of pixels to form a rasterized pattern, said rasterizing including assigning respective edge adjustment values to pixels covering an edge of said pattern to be printed;

said respective edge adjustment values each being a fraction of a pixel width of a respective assigned pixel of the pixels covering the edge of the pattern to be printed, said fraction of said pixel width being a position at which a respective portion of said edge is to be placed within the respective assigned pixel, with reference to a respective neighboring pixel that is covered by said pattern to be printed;

said processing unit being further configured for dividing said rasterized pattern into a plurality of rasterized pattern planes;

each respective rasterized pattern plane of said plurality of rasterized pattern planes being associated with a respective radiant exposure for each pixel of the grid of pixels intended to be exposed by said respective rasterized pattern plane, such that the plurality of rasterized pattern planes are associated with respective radiant exposures;

wherein a sum of radiant exposures of said plurality of rasterized pattern planes for a pixel completely covered by said pattern to be printed exceeds a threshold for activating a radiation sensitive layer on a substrate, onto which said pattern is to be printed;

wherein a sum of radiant exposures of said plurality of rasterized pattern planes for each respective pixel of the pixels covering the edge of said pattern to be printed is an exposure moving a respective position of where the sum of radiant exposures for the respective pixel reaches said threshold for activating said radiation sensitive layer at the respective pixel, the exposure moving the respective position by a respective distance equal to a respective edge adjustment value that is assigned to the respective pixel;

said output interface is configured for outputting data representing said plurality of rasterized pattern planes; and wherein said processing unit is further configured for selecting said radiant exposures such that at least two of said respective radiant exposures of said plurality of rasterized pattern planes have different magnitudes with respect to each other.

12. The rasterization module according to claim 11, wherein said processing unit is further configured for selecting said radiant exposures such that all of said respective radiant exposures of said plurality of rasterized pattern planes have different magnitudes with respect to each other.

13. A pattern generator, comprising:

a control module; and an imaging module arranged for writing a pattern to a stamp area by means of a spatial light modulator, said spatial light modulator having an array of individually controllable elements arranged for generating a grid of pixels within a stamp area on a target surface, where illumination of each individual pixel of the grid of pixels is controlled by a respective individually controllable element of the array of individually controllable elements;

said control module being configured for obtaining data representing n rasterized pattern planes associated with a pattern to be printed from the rasterization module according to claim 11;

said imaging module being configured for arranging said spatial light modulator according to a stamp area of a first rasterized pattern plane of the plurality of rasterized pattern planes;

said imaging module being configured for exposing a substrate having said radiation sensitive layer for a dose of radiation corresponding to a radiant exposure associated with said first rasterized pattern plane;

said imaging module being configured for repeating said arranging said spatial light modulator and said exposing for remaining rasterized pattern planes of the plurality of rasterized pattern planes by exposing the substrate respective associated doses of radiation associated with the remaining rasterized pattern planes; and said imaging module being further configured for repeating said arranging said spatial light modulator, said exposing and said repeating of said arranging and said exposing for additional stamp areas in accordance with a scanning scheme.

14. The pattern generator according to claim 13, wherein said control module is further configured for selecting the plurality of rasterized pattern planes to be used by said imaging module in time so that at least two rasterized pattern planes of the plurality of rasterized pattern planes are surrounded in time by rasterized pattern planes of the plurality of rasterized pattern planes associated with lower radiant exposures, resulting in a non-monotonically time variation of radiation doses for all pixels, wherein the non-monotonically time variation comprises both increases of said radiant exposures and decreases of said radiant exposures in time.

15. The pattern generator according to claim 13, further comprising:

an exposure level measuring unit, configured for measuring an exposure level of a pixel after exposing the substrate;

whereby said control module is further configured for adjusting parts of said plurality of rasterized pattern planes not yet being used, to compensate for any deviance from an expected exposure level.

16. The pattern generator according to claim 14, further comprising:

an exposure level measuring unit, configured for measuring an exposure level of a pixel after exposing the substrate;

whereby said control module is further configured for adjusting parts of said plurality of rasterized pattern planes not yet being used, to compensate for any deviance from an expected exposure level.

17. A pattern generator, comprising:

a control module; and an imaging module arranged for writing a pattern to a stamp area by means of a spatial light modulator, said spatial light modulator having an array of individually controllable elements arranged for generating a grid of pixels within a stamp area on a target surface, where illumination of each individual pixel is controlled by a respective individually controllable element of the array of individually controllable elements;

said control module being configured for obtaining data representing n rasterized pattern planes associated with a pattern to be printed from the rasterization module according to claim 12;

said imaging module being configured for arranging said spatial light modulator according to a stamp area of a first rasterized pattern plane of the plurality of rasterized pattern planes;

said imaging module being configured for exposing a substrate having said radiation sensitive layer for a dose of radiation corresponding to a radiant exposure associated with said first rasterized pattern plane;

said imaging module being configured for repeating said arranging said spatial light modulator and said exposing for remaining rasterized pattern planes of the plurality of rasterized pattern planes by exposing the substrate with respective associated doses of radiation associated with the remaining rasterized pattern planes; and said imaging module being further configured for repeating said arranging said spatial light modulator, said exposing and said repeating of said arranging and said exposing for additional stamp areas in accordance with a scanning scheme.

18. The pattern generator according to claim 17, wherein said control module is further configured for selecting the plurality of rasterized pattern planes to be used by said imaging module in time so that at least two rasterized pattern planes of the plurality of rasterized pattern planes are surrounded in time by rasterized pattern planes of the plurality of rasterized pattern planes associated with lower radiant exposures, resulting in a non-monotonically time variation of radiation doses for all pixels, wherein the non-monotonically time variation comprises both increases of said radiant exposures and decreases of said radiant exposures in time.

19. The pattern generator according to claim 17, further comprising:

an exposure level measuring unit, configured for measuring an exposure level of a pixel after exposing the substrate;

whereby said control module is further configured for adjusting parts of said plurality of rasterized pattern planes not yet being used, to compensate for any deviance from an expected exposure level.

20. The pattern generator according to claim 18, further comprising:

an exposure level measuring unit, configured for measuring an exposure level of a pixel after exposing the substrate;

whereby said control module is further configured for adjusting parts of said plurality of rasterized pattern planes not yet being used, to compensate for any deviance from an expected exposure level.

* * * * *